(12) United States Patent
Hu et al.

(10) Patent No.: US 11,959,164 B2
(45) Date of Patent: Apr. 16, 2024

(54) HIGH DAMAGE THRESHOLD AND HIGHLY RELIABLE BROAD-BAND MID-IR COATINGS FOR HIGH POWER FLUORIDE FIBER LASER

(71) Applicants: Yimin Hu, Clarksville, MD (US); Feng Niu, Arlington Heights, IL (US); Wei Lu, Great Falls, VA (US)

(72) Inventors: Yimin Hu, Clarksville, MD (US); Feng Niu, Arlington Heights, IL (US); Wei Lu, Great Falls, VA (US)

( * ) Notice: Subject to any disclaimer, the term of this patent is extended or adjusted under 35 U.S.C. 154(b) by 59 days.

(21) Appl. No.: 17/691,537

(22) Filed: Mar. 10, 2022

(65) Prior Publication Data

US 2023/0287557 A1 Sep. 14, 2023

(51) Int. Cl.
*C23C 14/30* (2006.01)
*C23C 14/08* (2006.01)
*C23C 28/00* (2006.01)

(52) U.S. Cl.
CPC ............ *C23C 14/30* (2013.01); *C23C 14/081* (2013.01); *C23C 14/083* (2013.01); *C23C 28/3455* (2013.01)

(58) Field of Classification Search
CPC ...... C23C 14/30; C23C 14/081; C23C 14/083
See application file for complete search history.

(56) References Cited

U.S. PATENT DOCUMENTS

| | | | | |
|---|---|---|---|---|
| 5,688,608 A * | 11/1997 | Tsai | ........................ | C23C 14/06 |
| | | | | 359/359 |
| 6,510,276 B1 * | 1/2003 | Jain | ..................... | H01S 3/06716 |
| | | | | 359/341.1 |
| 11,521,896 B2 * | 12/2022 | Tien | .................. | H01L 21/76831 |
| 2002/0105721 A1 * | 8/2002 | Paul | ........................ | G02B 1/115 |
| | | | | 359/359 |

(Continued)

OTHER PUBLICATIONS

Matsuoka, Yohei, et al., "Broadband multilayer anti-reflection coating for mid-infrared range from 7 μm to 12 μm". Applied Optics, vol. 57, No. 7, Mar. 1, 2018, pp. 1645-1649.*

Pfeiffer, Kristin, et al., "Wide-Angle Broadband Antireflection Coatings Prepared by Atomic Layer Deposition". ACS Applied Materials & Interfaces, 2019 11 (24), 21887-21894.*

(Continued)

*Primary Examiner* — Bret P Chen

(57) ABSTRACT

This invention provides a process or fabrication method of forming broadband anti-reflective (AR) coating over the mid-IR fluoride fiber for high power laser applications in mid-IR wavelength range. The AR coating consists of multiple-pair Lithium fluoride (LiF) and $Al_2O_3$, and was deposited by electron beam physical vapor deposition with an iron assistant source at low temperature (<60° C.). A thin encapsulation layer of $Al_2O_3$ was applied over the AR coating by atomic layer deposition technology. The measurements show the coating has a reflectivity of <1-1.5% in the range of 1.5-5.5 μm. The laser induced damage threshold (LIDT) test shows the damage threshold is greater than 8.9 MW/cm2 with no sign of any damage on the coating exposed to atmosphere. The durability and environmental tests of the AR coating with PVD coated encapsulation layer show good humidity resistance in open air and no degradation of film quality and optical performance are observed.

7 Claims, 5 Drawing Sheets

(56) References Cited

U.S. PATENT DOCUMENTS

| | | | | |
|---|---|---|---|---|
| 2006/0093833 | A1* | 5/2006 | Meyer | C03C 17/007 65/32.4 |
| 2008/0119098 | A1* | 5/2008 | Palley | D06M 23/00 428/221 |
| 2011/0311183 | A1* | 12/2011 | Owen, III | G02B 6/3818 385/62 |
| 2012/0058697 | A1* | 3/2012 | Strickland | B82Y 15/00 428/323 |
| 2013/0033753 | A1* | 2/2013 | Su | B05D 1/60 359/581 |
| 2013/0294467 | A1* | 11/2013 | Moloney | H01S 5/14 372/20 |
| 2015/0315063 | A1* | 11/2015 | Owen | G02B 6/02295 65/529 |
| 2015/0380889 | A1* | 12/2015 | Winarski | H01S 3/06754 359/341.5 |
| 2016/0072249 | A1* | 3/2016 | Henderson Sapir | H01S 3/091 372/70 |

OTHER PUBLICATIONS

Guo, Xin, et al., "Broadband Anti-Reflection Coatings Fabricated by Precise Time-Controlled and Oblique-Angle Deposition Methods". Coatings, 2021, 11, 492, pp. 1-10.*

Tokita, Shigeki, et al., "Liquid-cooled 24 W mid-infrared Er:ZBLAN fiber laser". Optics Letters, vol. 34, No. 20, Oct. 15, 2009, pp. 3062-3064.*

Abdi, Rochi El, et al., "Mechanical characterization of fluoride optical fibers." Journal of Basic and Applied Research International, 2016, 15(2), pp. 1-16.*

Yoshida, Toshiya, et al., "Fluoride antireflection coatings for deep ultraviolet optics deposited by ion-beam sputtering". Applied Optics, vol. 45, No. 7, Mar. 1, 2006, pp. 1375-1379.*

Park, Hyunwoo, et al., "Thin-film encapsulation of Al2O3 multidensity layer structure prepared by spatial atomic layer deposition". Journal of Vacuum Science and Technology A, 38(6), Nov./Dec. 2020, 062403, pp. 1-7.*

* cited by examiner (a) Coated BK7 glass chip (b) Coated InF fiber glass chip (c) Fluoride fiber tips

HIGH DAMAGE THRESHOLD AND HIGHLY RELIABLE BROAD-BAND MID-IR COATINGS FOR HIGH POWER FLUORIDE FIBER LASER

ACKNOWLEDGEMENT OF GOVERNMENT SUPPORT

This invention was made with government support under Contract No. N6833520C0120 awarded by the U.S. Department of Defense. The government has certain rights in the invention.

CROSS-REFERENCE TO RELATED APPLICATIONS

1. M. D. Groner, S. M. George, et al., "Gas diffusion barriers on polymers using atomic layer deposition," Applied Phys. Letts., 88, 051907 (2006).
2. H. A. Macleod, D. Ristau, "Advances in Optical Thin Films VI", edited by Michel Lequime, Proc. of SPIE Vol. 10691, 106911B(2018).
3. H. Liu, L. Jensen, J. Becker, M. C. Wurz, P. Ma, D. Ristau, "Comparison of ALD and IBS $Al_2O_3$ films for high power lasers," Proc. SPIE 10014, Laser-Induced Damage in Optical Materials 2016, 1001421 (2016).
4. M. Razeghi, N. Bandyopadhyay, Y. Bai, Q. Y Lu, and S. Slivkenm, "Recent advances in mid infrared (3-5 µm) Quantum Cascade Lasers", Optical Materials Express Vol. 3, Issue 11, pp. 1872-1884 (2013).
5. J. Amirloo, S. Saini, and M. Dagenais, "Effect of Carrier Leakage on Optimal AR Coatings in Midinfrared Interband Cascade Lasers", IEEE Photonics J. 7, 1501511 (2015).
6. A. Duparré and S. Kassam, "Relation between light scattering and the microstructure of optical thin films", Appl. Opt. 32, 5475 (1993).
7. J. Amirloo, S. Saini, and M. Dagenais, "Comprehensive study of antireflection coatings for mid-infrared lasers", Journal of Vacuum Science & Technology A 34, 061505 (2016).
8. J. D. Rancourt, "Optical Thin Films User's Handbook", 1994, McGraw Hill.
9. P., S. F. and E. Colton, "Fluoride Compounds for IR Coatings", Thin Solid Films 209,109 (1992).

BACKGROUND OF THE INVENTION

1. Field of Invention

The present invention relates to design and fabrication method of high laser damage resistant broad band anti-reflective (BBAR) thin film optical coatings for heavy metal fluoride glass fibers such as indium fluoride ($InF_3$), ZBLAN for high power optical fibers laser and other fluoride optical components applications in MID infrared range (1.5 µm-5 µm).

2. Description of the Related Art

The Mid-IR fiber laser shows great potential to generate a high power, high pulse energy and single mode beam with the lasing wavelength between 1.5-5.5 µm. Due to their low absorption in the broad wavelength range from UV to mid infrared, fluorides have been used to make optical fibers and components. For example, typically Zirconium Fluoride (ZrF4) Fibers have Transmission range from 285 nm to 4.5 µm, and Indium Fluoride (InF3) Fibers have Transmission from 310 nm to 5.5 µm. Ever since the introduction of Er-Pr co-doped structure and very high Er doping in the Fluoride fiber, CW output power has been significantly increased from mW level to 10 sW and many pulsed source around 3 µm has been demonstrated with Er or Ho doped fluoride fiber laser. However, it is well known that the ZBLAN fiber tip has photo-degradation issue due to the water vapor contamination at the surface. At high power of 10 sW operation, the ZBLAN fiber tip can only sustain for a few seconds if exposed to normal environment. Several solutions have been proposed like filling dry nitrogen around fiber tip or splicing the ZBLAN fiber to an $AlF_3$ fiber end cap. Obviously a direct optical coating over the fiber tip not only protects the fiber tip from environmental water vapor contamination but also plays a role either as cavity coupler of a fiber laser or anti-reflection (AR) in high intensity mid-IR fiber delivery system.

In order to achieve broadband optical performance in mid-infrared (IR) wavelength range, an AR coating with multilayer design of high refractive index layers and low refractive index layers—is usually necessary. However, a big challenge in developing good optical coatings for high-power applications is the limitation of available coating materials that with high laser-induced damage threshold (LIDT) and long term reliability at the MID IR range.

Among high index or medium index materials to transmit signal in wavelength range from 1.4 to 5 µm, aluminum oxide ($Al_2O_3$)m Yttrium Oxide ($Y_2O_3$), Hafnium Oxide ($HfO_2$) are considered to be one of the most attractive materials due to their thermal and chemical stability, excellent dielectric properties, and optical transparency over broad wavelength range and high LIDT. Thorium fluoride was used exclusively as the low-index material in combination with ZnS to make MWIR and LWIR coatings. Because ThF4 is a radioactive alpha emitter, it was prohibited from use in coating for most applications. Fluorides ($YF_3$, $YbF_3$, $MgF_2$, and LiF) are good candidates in making a low index layer. However fluorides such as LiF are hydroscopic and highly moisture-sensitive, which make optical coatings not reliable especially under harsh environments. Alternatively, the combination of Chalcogenide (ZnSe, ZnS) and Oxides ($Al_2O_3$, $Y_2O_5$) are used for high power multiple layer coatings. This combination has compromised performance for substrates materials of low refractive index, such as ZBLAN or $InF_3$. The chalcogenides has further drawbacks due to their softness. The combination of Chalcogenides/fluorides are also used, but thick chalcogenides/fluorides stacks are not stable due to the water absorption of fluorides when exposed to air and are thus not suitable for high power applications.

To overcome this limitation, we designed a BBAR coatings and developed a novel fabrication process by using atomic layer deposited (ALD) encapsulation layer to improve moisture resistance and reliability in harsh environment.

ALD is a cyclic process carried out by dividing a conventional chemical vapor deposition (CVD) process into an iterated sequence of self-saturating deposition cycles. See e.g., T. Suntola, Thin Solid Films, 216(1992) 84-89. Unlike CVD where the reacting gases are mixed in the process chamber and continuously react to form a film, ALD reacting gases are delivered separately to react with the surface instead of with each other. Each reaction is self-terminating, depositing a single layer at a time, independent of gas flow distribution or gas transport into substrate features and forming super conformal, continuous coatings in relatively low process temperatures. ALD technique has become a very promising technology in making ultrathin optical coatings used in high-power laser systems. The ALD technique for $Al_2O_3$ is well known for low temperature process and precise thickness control in atomic scale with excellent reproducibility. The films are pinhole free with super low impermeability to moisture and air, with high mechanical hardness close to sapphire, good corrosion resistance, and excellent dielectric breakdown. Recent work shows that AR coatings using ALD $Al_2O_3$ in ultraviolet (UV) and near-IR ranges have higher LIDT (at 10 ns, 100 Hz pulsed) compared to PVD $Al_2O_3$.

BRIEF SUMMARY OF THE INVENTION

This invention provides a highly reliable thin film optical coating with a high laser-induced damage threshold (LIDT) >8.9 $MW/cm^2$ at Mid-IR wavelength range (1.5 um-5.5 um) on end-surfaces of heavy metal fluoride optical fibers (InF, ZrF4, etc.) and other optical components, and related deposition techniques in a combination of conventional physical vapor deposition (PVD) and atomic layer deposition (ALD) for high power laser transmission. The optical coating consists of low refractive index (n<1.5) fluorides, and medium or high refractive index oxides (n>1.5) in a thin film stack combination of balanced stress. The aluminum oxide ($Al_2O_3$) layer is deposited by ALD as the encapsulation layer to block moistures from environment, may also be used as the adhesion layer to enhance the bonding to the fluoride fiber glasses. This coating always passes abrasion resistance test specified at MIL-C-14806A para 4.4.7 and MIL-M_13508C, adhesion test specified at MIL-C-48497A para. 4.5.3.1, and Humidity resistance test specified at MIL-C-48497A para. 4.5.3.2.

This coating and related ALD process should not be limited to the above but applied to any coatings consisting of high, medium index materials, and low index hydroscopic materials transparent in the mid-IR wavelength range. The optical coatings should be used as any anti-reflective and broadband coatings (AR/BBAR), partial reflective coatings (PR), highly reflective coatings (HR), and many others optical components for high power operation. A broad spectrum (1.5 μm~5.5 μm) MID-IR antireflection coating is realized as shown in FIG. 3. This coating withstands high continuous laser power density >8.8 $MW/cm^2$ @4.6 μm. It passes abrasion resistance test specified at MIL-C-14806A para 4.4.7 and MIL-M_13508C, adhesion test specified at MIL-C-48497A para. 4.5.3.1, and Humidity resistance test specified at MIL-C-48497A para. 4.5.3.2.

Novelty of the Invention

This current invention compared to previous art and conventional optical coatings has following advantages:
1. Fluoride thin films are susceptive to the absorption of moistures when exposed to the air which will leads to the degradation of the thin film coating. An $Al_2O_3$ thin film encapsulation layer is added to interface the air as environmental barrier. It significantly improves the environmental stability of the optical coating. The $Al_2O_3$ encapsulation layer can be grown by ALD or PVD techniques in mild environments. ALD is preferred because it can grow pin-hole film and it is able to cover both from surface and stack edges due to its inherent conformity.
2. A layer of $Al_2O_3$ of thin thickness (<50 nm) is added between the substrate (fluoride bulky material or fluoride fiber) and the thin film stack to enhance the adhesion of the thin film stack to the fluoride fiber glasses and act as chemical diffusion barrier.
3. The $Al_2O_3$ encapsulation layer by ALD can be applied to many other optical coating, including coating of moisture sensitive fluoride or, soft chalcogenide (ZnSe, ZnS) and broaden coatings designs or filters of large total film thickness.
4. The rest layers of the optical coating of alternating oxide and fluoride have balanced (compressive and tensile) stress. It leads to very low total stress so shat a multiple layer thin film stack is physically stable and reliable especially in thermal cycling conditions.
5. This thin film system has lower absorption from 1.5-5.5 μm.
6. This coating and related ALD process demonstrate that LIDT>8.9 $MW/cm^2$ at Mid-IR wavelength range (1.5 μm-5.5 μm) on end-surfaces of heavy metal fluoride optical fibers ($InF_3$, $ZrF_4$, etc.) and other optical components with no sign of any damage on the coating, which are well suitable for high power laser transmission such as QCL high power lasers up to 5.5 μm.
7. Excellent Durability/environmental reliability: Good Adhesion: mechanical test using Scotch tape indicates good adhesion of the coating films; Abrasion Resistant: The coated surface was rubbed repeatedly by Kim wipes which is socked with Acetone or Isopropyl alcohol. There is no sign of damage on the coating films. The coated surface can be cleaned by typical solvents. Good humidity resistance in open air and 95 RH % at 50 deg C. for 48 hours, no degradation of film quality and optical performance are observed.

BRIEF DESCRIPTION OF THE SYMBOLS

10 Fluoride substrate. It can be bulk fluoride material or fluoride optical fiber.
20 A thin $Al_2O_3$ has an adhesion layer.
30 Fluoride/Oxide thin film pair.
The fluoride thin film can be of any choice or a combination of these fluorides:
40 A number of Fluoride/Oxide thin films.
50 A thin $Al_2O_3$ encapsulation layer.

DETAILED DESCRIPTION OF THE INVENTION

Figure 1:
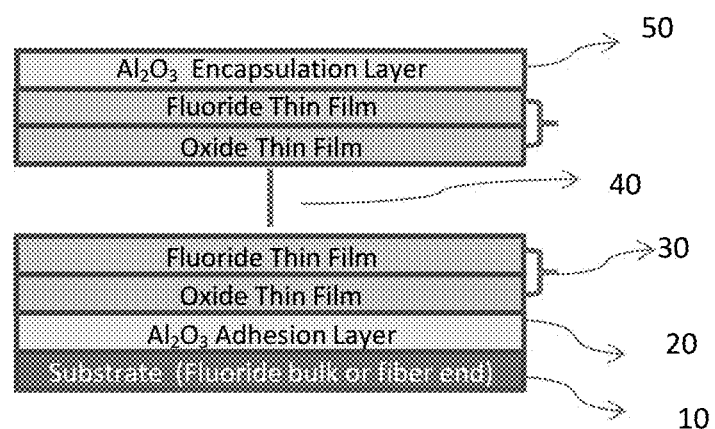
FIG. 1 shows a schematic of invented coating design consisting of multiple layer optical coatings for fluoride glass fibers encapsulated by a super thin ALD $Al_2O_3$ coating.

Various embodiments of the invention shown in FIG. 1 are described more fully hereinafter with reference to be the accompanying drawings, in which one embodiment of the invention is shown in the FIG. 3. Instead, these inventions may be embodied in many different forms and should not be construed as limited to the embodiments set forth herein; rather, these embodiments are provided so that this disclosure will satisfy applicable legal requirements.

Coating Design and Optimization

Coating designs were first conducted using TFCal modeling to come up with the initial design by using several optimization methods including multiple target, needle, and symmetric and non-symmetric equivalent thickness methods. The refractive index (n) and absorption coefficient of materials (k) are from published data which are used for initial simulation, modeling and screening. At least $k<10^{-3}$ to $10^{-4}$ were used to screen possible transparent dielectric materials in the 1.4-5 µm region. Note that the n and k values are heavily dependent on deposited methods, specific growth parameters and applied discharge voltage/current in IAD. As a result, the final broad-band AR coating design was fine-tuned based on measured n and k by ellipsometry from single layer deposited by the PVD technique. The design took consideration of the most popular fiber glasses including InF and ZrF4 (ZBLAN) as the substrates. $Al_2O_3$ is selected as the medium high refractive index (n) material due to its excellent resistance to high power laser damage, and high electric breakdown field in short laser pulsed mode. LiF is selected as the lower refractive index material due to its lowest n in the fluorides and high contrast of refractive index ratio ($Al_2O_3$/LiF). Different angles of incident (AOI) were also calculated to prove no significant effect on AR optical performance.

The initial design was further optimized based on measured refractive indexes of single layer LiF, $Al_2O_3$ over the fluoride fiber glass, and measured single layer stress. These include:

a. The stress of both films is well balanced (compressive and tensile), leading to very low total stress.
b. Reduction of single layer thickness to minimize stress and thus possible micro-cracks observed in previous experiments.
c. A super thin $Al_2O_3$ encapsulation layer (20 nm) was added on top of the 3 pair stack by PVD leading to significantly low water absorption compared to no encapsulation layer.

Based on the measured n values, the original optical coating design was further refined. FIG. 3(left) show refined design. Note that the refined design also reduces single layer $Al_2O_3$ thickness in each layer in order to reduce possible stress. In the previous experiments we observed microcracks or peeling-off in some coatings. Here is the new recipe we used in the coating process. An encapsulation layer of 20 nm $Al_2O_3$ is also added on top of the stack to prevent water absorption on underneath LiF layers.

PVD Process

Denton Explorer E-beam evaporator (www.dentonvacuum.com) with IAD was used for PVD $Al_2O_3$ and LiF deposition. The PVD system is designed for precise optical coating. The 2" flat substrate holder can deliver good thickness uniformity (max. dev %<1-2%). High-power resistant heater can heat substrate temperature up to 250° C. A quartz crystal microbalance (QCM) crystal sensor is installed to control deposition thickness and rate.

Figure 3:
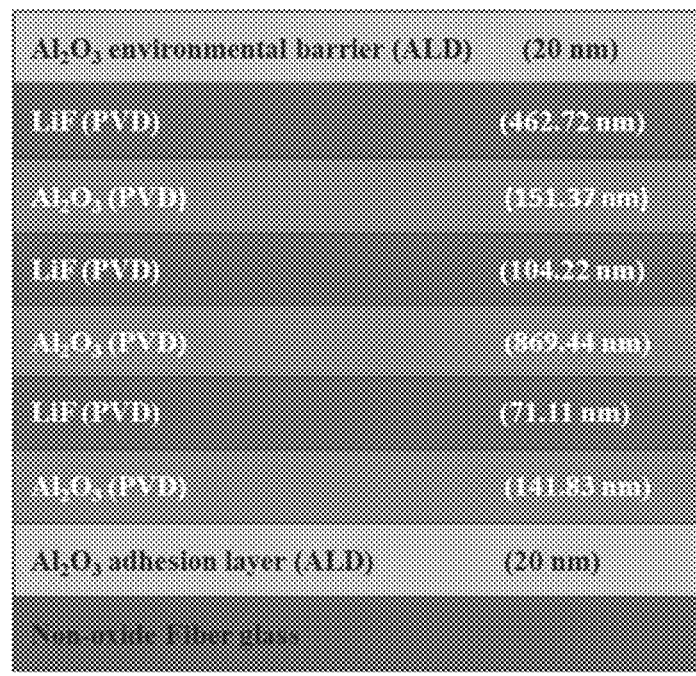
FIG. 3 shows an embodiment design and experimental result of multilayer coatings on InF glass vs design and modeling.
Figure 3:
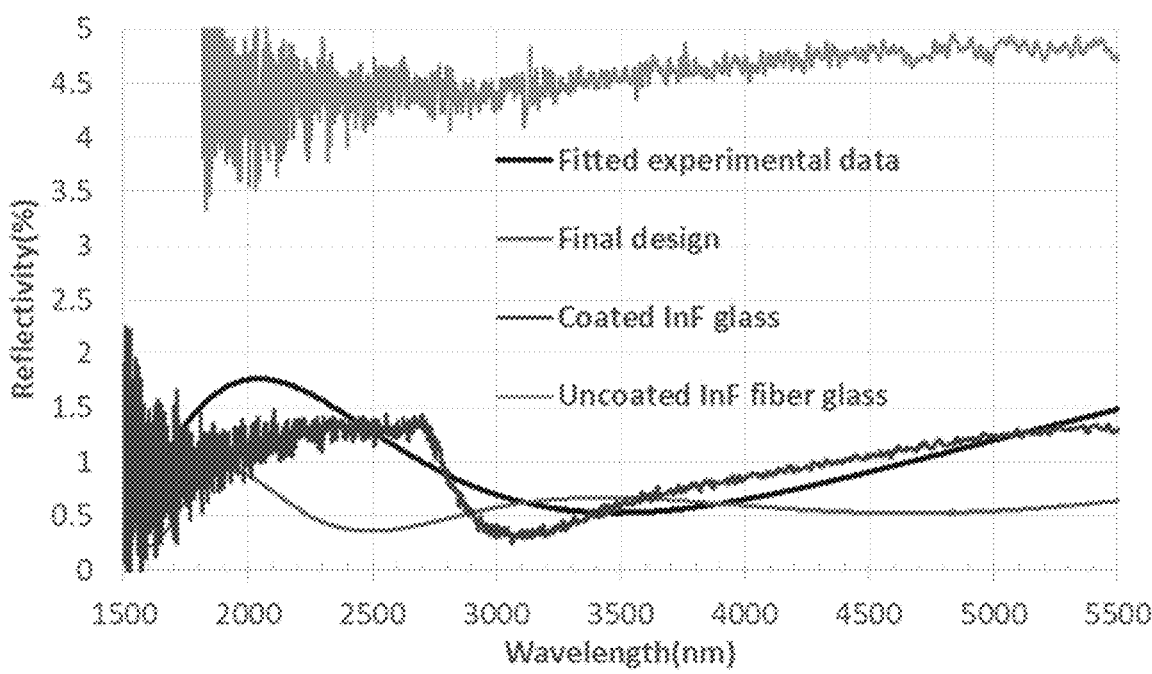

In the embodiment shown in FIG. 3, 3 pair LiF/$Al_2O_3$ are the representative of fluoride/oxide low index and high index material combination. Each layer was deposited in sequence. During the deposition of each layer, the ion gun with corresponding gas source are turned on and stabilized, e-gun is then turned on to soak the material and open the shutter to start deposition. The process is reversed when the layer is reached the designed thickness. The LiF layer is deposited with Argon ion assistance. The $Al_2O_3$ is deposited with Oxygen ion assistance. Deposition rate was maintained at ~2-5Å/s to reduce stress.

ALD Process

An alternative encapsulation layer of $Al_2O_3$ was developed by ALD at low temperature with TMA and ozone. ALD deposition was conducted in a Beneq TFS 500 ALD system that is currently configured for either thermal (using $H_2O$ as the oxidant), and ozone deposition of $Al_2O_3$. A special fixture and substrate is designed for coating on end-faces of multiple-bundle optical fibers and to prevent coating on other areas. To be compatible with low deformation temperature of fluoride fiber glasses (~60° C.), deposition temperatures has to be maintained at 60-100° C. A special fixture and substrate were designed for coating on end-faces of multiple-bundle optical fibers and to prevent coating on other areas. Note that to be compatible with low deformation temperature of fluoride fiber cladding layer (60° C.), deposition temperatures has to be maintained at 60-100° C.

We initially used thermal ALD process with $H_2O$ as the oxidant at both 150° C. and 60° C. and noticed coating surface peeling off right after ALD process even at 150° C. and believe it was related to water absorption of LiF layer during ALD process. We then decided to use dry ozone process to avoid moisture. At 60° C. deposition temperature $Al_2O_3$ of 500 cycles by ozone as the oxidant showed a growth rate of 0.5Å/cycle consistent with literatures. ALD $Al_2O_3$ has been proven there are many advantages over traditional PVD deposited material such as superior environmental barrier property, good mechanical hardness close to diamond and excellent conformity which is expected to provide excellent long term environmental durability of coated fiber end face such as humidity resistance of coating stack sidewalls.

Test Results

Morphology

Figure 2:
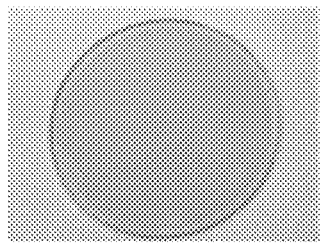
FIG. 2 shows surface morphology of the BBAR coating on (a) BK7 glass chip; (b) InF fiber glass chip; (c) SMA fluoride fiber tip.
Figure 2:
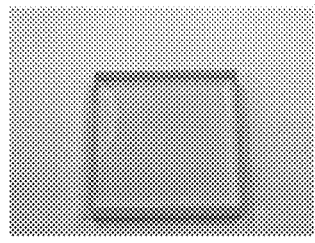
Figure 2:
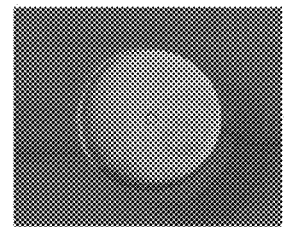

Using the above optimized coating recipe for each layer thickness, a multilayer coating was deposited on an InF fiber glass, a BK7 glass chip and SMA fluoride fiber tips separately. FIG. 2 shows the coated witness samples with a regular glass chips and fluoride fiber tip, respectively. Optical microscope shows no sign of any micro-cracks or film peeling off after PVD coating process. The surface is also smooth on both BK7 glass chip and InF fiber glass.

Optical Performance

The Vertex 80 FT-MIR spectrometer by Bruker was used for reflectivity measurements in near-IR, mid-IR, and up to far-IR range with signal sensitivity <0.1%. An Ag coated window is used for background measurement before real samples. FIG. 3 shows measured reflectivity on the coated InF fiber glass witness sample in comparison with that of an uncoated InF fiber glass sample. Reflectivity was measured using an Au mirror as 100%, and calibrated for background noise and contributions from backside reflectivity. Measured reflectivity on InF fiber glass shows AR<1.0-1.5% in the range of 1.5-5.5 µm, significantly lower than those on uncoated InF fiber glasses. We measured the reflectivity several times even 1-2 years after the coating was done. The results are the same and no obvious water absorption related peaks are observed. We believe the main reason is that an $Al_2O_3$ encapsulation layer was added to prevent water absorption of underneath LiF layers. The improved pre-outgassing of the vacuum chamber and pre-soaking conditioning of the source materials also help to prevent water absorption. FIG. 3 also shows the calculated AR reflectivity (dark line) based on the ellipsometer fitting data which is consistent with the measured AR reflectivity on the coated InF fiber glass. The final design (green line) is also present to compare differences of experimental and targeted optical performance.

Laser Damage Resistance Test

Figure 4:
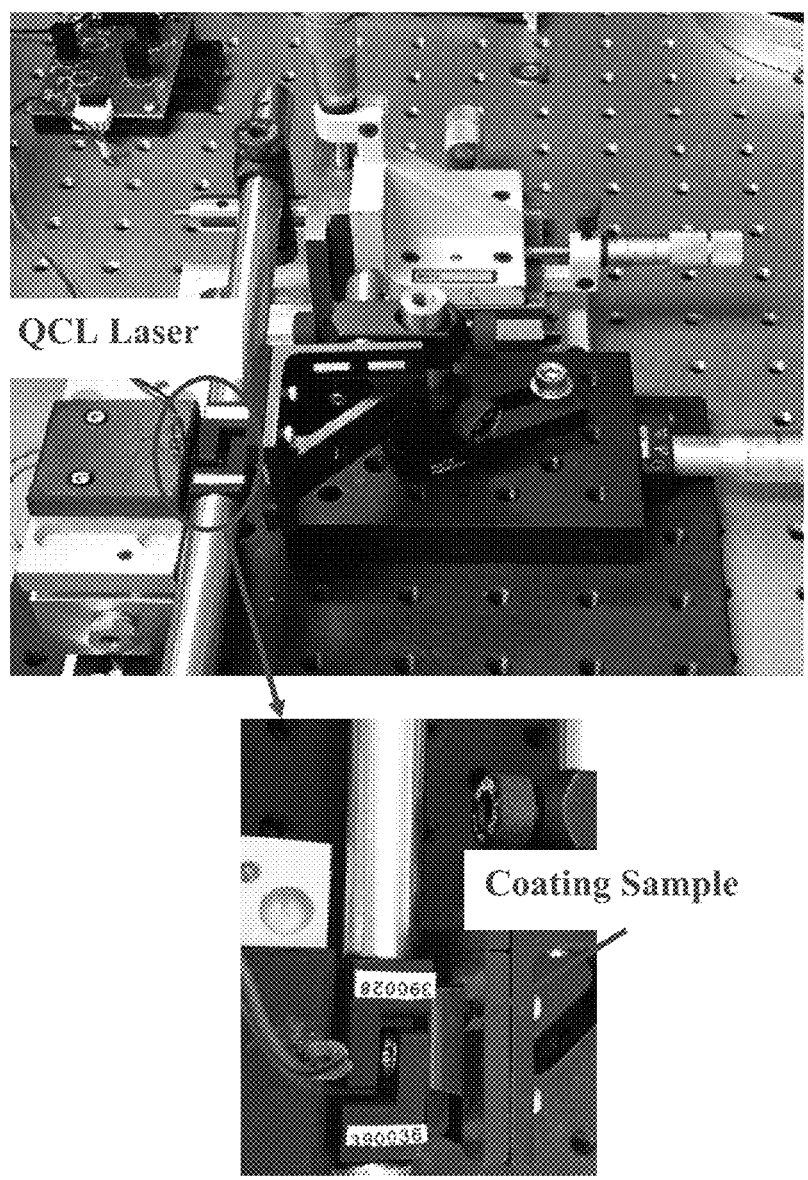
FIG. 4 Laser damage resistance test setup using a CW mid-IR QCL laser.

In the test setup, Thorlabs' QF4050D3, a 4.0 µm singel spacial mode QCL laser is used as the laser source, shown in FIG. 4. The spot size of this laser is 3.9 µm×2.0 µm. A molded IR aspheric lense of focus length of 5.95 µm was used to collect and collimate the output laser beam from the QCL laser. The measured collimated laser power is 500 mW. Another IR aspheric lense of focus length of 4.0 µm is used to focus the light onto the surface of the AR coated InF fiber glass substate. The distance of the surface of the coated fiber glass substate and the surface of the collimator lens is set at the working distance of the focus length of 3.1 mm. The size of the fiber glass substate is 18 mm×18 mm×4 mm. Only the coated facet is polished. The minimum spot size on the coated fier glass surface is 3.9×2.0×4.0/5.95-5.3 µm². The input laser beam quickly diverses after entering the fiber glass substate due to the short focus length, and scattered by the unpolished back surface. The fiber glass substate is mounted on a translation stage. In order to make sure the minimum spot is focused on the substrate surface, the test is repeated multiple times by adjusting the distance between the glass surface and the focusing length.

The demagnification of the dual lens system can be estimated by ratio of their focus length: M=f₁/f₂=4.0/5.95~0.67. The reduced spot size entensifies the beam density. Because the seond lens' clear aperture is smaller than the first lens, the collimated beam is clipped by the second lens, resulting in transmission loss (L)-0.38. The power density on the IFG surface can be approximated by:

$$I = \frac{P}{A} = \frac{P_0(1-L)}{A_0 M^2} = \frac{500 \times (1-0.38)}{3.9 \times 2.0 \times 0.67^2} \sim 89 \text{ mW}/\mu m^2 = 8.9 \text{ MW}/cm^2$$

The duration of exposure is 15 minutes, and then the coated surface is examed by a 200× microscope. There is no visible damage to the coated film observed.

Humidity Test in Harsh Environment

Figure 5:
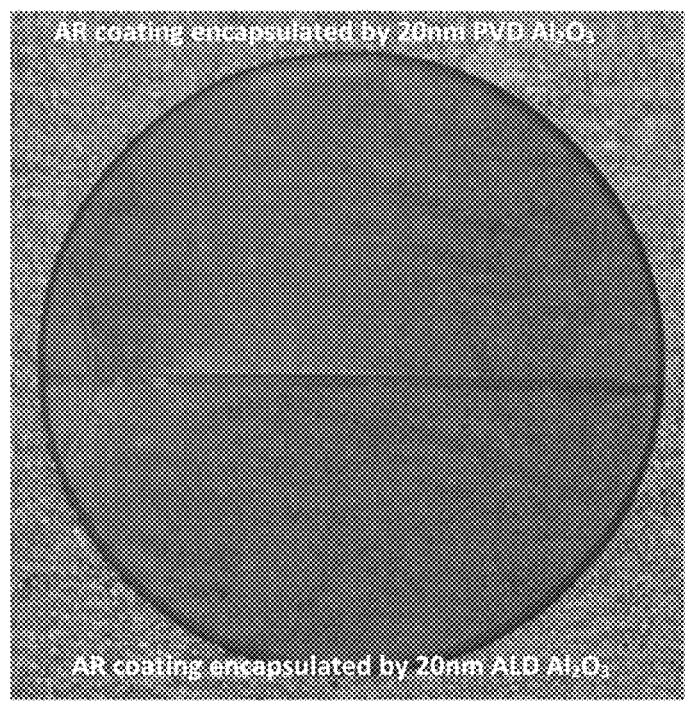
FIG. 5 surface morphology of a comparison of ALD vs PVD encapsulation layers after a humidity test side by side.

In order to compare moisture resistance of AR coating with a PVD encapsulation layer vs ALD one, a AR coated BK7 glass chip was cut in half and one half was subsequently coated with 20 nm $Al_2O_3$ in a low temperature dry ozone process. Then the both halves were boiled side by side in water for 15 minutes. The top half with 20 nm PVD $Al_2O_3$ as shown in FIG. 5 shows severe discoloration and degradation, particularly along chip round and cut edges. In contrary, ALD coated bottom half show much less discoloration and degradation along its edges. This indicates that excellent conformity of ALD can not only protect surface area but also side walls of AR coating stack which are more vulnerable to moisture attach. Traditional PVD coatings however have intrinsic shadow effects leading to much less coating protection particularly on side all of thick coatings.

This test demonstrates significant improvement of long term environmental stability of the designed thin film optical coatings that contain fluorides and thus absorption is minimized which is critical to high power laser operation.

Durability Tests:

The durability requirements of coated surfaces, such as AR coatings, on glass and other substrates that are exposed to external environments are specified in MIL-C-14806 and MIL-C-48497C.

Abrasion Resistance Test: The coated optical surface will show no signs of deterioration, other than discoloration, after being subjected to a 100-Rub Eraser Test with a bearing force of 0.9-1.1 kg as per MIL-C-14806A, para. 4.4.7. The coated optical surface will show no signs of deterioration after a 600-Rub Test with a dry laundered cheesecloth pad approximately 9.53 mm in diameter and 12.7 mm thick with a bearing force of 0.9-1.1 kg as per MIL-M-13508C.

Adhesion Test: The coated optical surface will show no signs of delamination or other deterioration after a snap tape test using Scotch #610 tape as per MIL-C-48497A, para. 4.5.3.1.

Humidity Resistance Test: The coated optical surface will show no signs of deterioration after a 48-hour humidity exposure (50° C., 95% relative humidity), as per MIL-C-48497A, para. 4.5.3.2.

What is claimed is:

1. A method of forming a laser damage resistant and reliable broad band anti-reflective optical coating for high power mid-IR laser components at 8.9 MW/cm² comprising the steps of:
   a) providing a heavy metal fluoride glass fiber consisting of InF, ZrF4, or ZBLAN as a substrate in the mid-IR wavelength range of 1.5 to 5.5 µm;
   b) depositing a broad band anti-reflective optical coating consisting of a low refractive index fluoride layer having n<1.5 and a high refractive index oxide layer having n>1.5 by a physical vapor deposition process onto said heavy metal fluoride glass fiber; and
   c) depositing an $Al_2O_3$ encapsulation layer having a thickness less than 50 nm onto said optical coating layers, wherein said $Al_2O_3$ encapsulation layer is deposited by atomic layer deposition at a temperature between 60-100° C. using TMA and an oxidant.

2. The method of claim 1 the low refractive index fluoride layer is selected from the group consisting of $YbF_3$, $CaF_2$, LiF, $MgF_2$, $Na_3AlF_8$, $SrF_3$, $BaF_2$, $AlF_3$, $LaF_3$, $InF_3$, and $YF_3$.

3. The method of claim 1 the high refractive index oxide layer is selected from the group consisting of $HfO_2$, $Nb_2O_5$, $TiO_2$, $Y_2O_3$, and $Al_2O_3$.

4. The method of claim 1 wherein the oxidant is ozone.

5. The method of claim 1 wherein the oxidant is $H_2O$.

6. The method of claim 1 wherein the $Al_2O_3$ encapsulation layer thickness is 20 nm.

7. The method of claim 1 wherein the physical vapor deposition process is electron beam evaporation, thermal evaporation, ion assistant deposition, or sputtering.

* * * * *